United States Patent
Sun et al.

(10) Patent No.: US 6,653,242 B1
(45) Date of Patent: Nov. 25, 2003

(54) SOLUTION TO METAL RE-DEPOSITION DURING SUBSTRATE PLANARIZATION

(75) Inventors: Lizhong Sun, San Jose, CA (US); Stan D Tsai, Fremont, CA (US); Shijian Li, San Jose, CA (US); John M White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 216 days.

(21) Appl. No.: 09/608,078

(22) Filed: Jun. 30, 2000

(51) Int. Cl.[7] .................................. H01L 21/302
(52) U.S. Cl. ............... 438/738; 438/693; 252/79.1; 252/79.2; 252/79.4
(58) Field of Search .................. 438/738, 693; 252/79.2, 79.4, 79.1

(56) References Cited

U.S. PATENT DOCUMENTS

| | | | |
|---|---|---|---|
| 4,169,337 A | 10/1979 | Payne | 51/283 R |
| 4,588,421 A | 5/1986 | Payne | 51/308 |
| 4,752,628 A | 6/1988 | Payne | 523/122 |
| 4,867,757 A | 9/1989 | Payne | 51/293 |
| 5,264,010 A | 11/1993 | Brancaleoni et al. | 51/308 |
| 5,476,411 A | 12/1995 | Held, III | 451/36 |
| 5,614,444 A | 3/1997 | Farkas et al. | 437/225 |
| 5,700,383 A | 12/1997 | Feller et al. | 216/88 |
| 5,738,574 A | 4/1998 | Tolles et al. | 451/288 |
| 5,738,800 A | 4/1998 | Hosali et al. | 216/99 |
| 5,756,398 A | 5/1998 | Wang et al. | 438/692 |
| 5,769,689 A | 6/1998 | Cossaboon et al. | 451/41 |
| 5,770,095 A | 6/1998 | Sasaki et al. | 216/38 |
| 5,772,780 A | 6/1998 | Homma et al. | 134/7 |
| 5,807,165 A | 9/1998 | Uzoh et al. | 451/41 |
| 5,840,629 A | 11/1998 | Carpio | 438/692 |
| 5,858,813 A * | 1/1999 | Scherber et al. | 438/693 |
| 5,866,031 A | 2/1999 | Carpio et al. | 252/79.1 |
| 5,876,508 A | 3/1999 | Wu et al. | 134/2 |
| 5,911,619 A | 6/1999 | Uzoh et al. | 451/5 |
| 5,911,835 A | 6/1999 | Lee et al. | 134/1.3 |
| 5,932,486 A | 8/1999 | Cook et al. | 438/692 |
| 5,958,794 A | 9/1999 | Bruxvoort et al. | 438/692 |
| 5,981,454 A | 11/1999 | Small | 510/175 |

(List continued on next page.)

FOREIGN PATENT DOCUMENTS

| | | | |
|---|---|---|---|
| EP | 0 659 858 A2 | 6/1995 | C09G/1/02 |
| EP | 0 846 742 A2 | 6/1998 | C09G/1/02 |
| EP | 0 913 442 A2 | 10/1998 | C09G/1/02 |
| FR | 2 722 511 | 1/1996 | C23G/1/14 |
| JP | 10-130632 | 5/1998 | C09K/3/14 |
| WO | 97/34030 | 9/1997 | C25F/3/22 |
| WO | 98/49723 | 11/1998 | H01L/21/321 |
| WO | 99/61540 | 12/1999 | C09G/1/02 |
| WO | 00/00561 | 1/2000 | C09G/1/02 |
| WO | 00/30159 | 5/2000 | H01L/21/00 |
| WO | 00/36037 | 6/2000 | C09G/1/02 |
| WO | 00/49647 | 8/2000 | H01L/21/302 |
| WO | 00/53691 | 9/2000 | C09K/3/14 |
| WO | 00/59682 | 10/2000 | B24B/37/04 |

*Primary Examiner*—Richard Elms
*Assistant Examiner*—Christian Wilson
(74) *Attorney, Agent, or Firm*—Moser, Patterson & Sheridan

(57) ABSTRACT

A method and composition for planarizing a substrate. The composition includes one or more surfactants, including one or more anionic surfactants, Zweitter-ionic surfactants, dispersers, or combinations thereof, one or more chelating agents, one or more oxidizers, one or more corrosion inhibitors, and deionized water. The composition may further comprise one or more agents to adjust the pH and/or abrasive particles. The method comprises planarizing a substrate using a composition including one or more surfactants of anionic surfactants, Zweitter-ionic surfactants, or combinations thereof.

22 Claims, 2 Drawing Sheets

U.S. PATENT DOCUMENTS

| | | | |
|---|---|---|---|
| 5,985,748 A | | 11/1999 | Watts et al. ................. 438/622 |
| 5,993,686 A | * | 11/1999 | Streinz et al. .............. 252/79.3 |
| 6,033,993 A | | 3/2000 | Love, Jr. et al. ............ 438/745 |
| 6,039,891 A | * | 3/2000 | Kaufman et al. .......... 252/79.1 |
| 6,042,741 A | | 3/2000 | Hosali et al. ............... 252/79.1 |
| 6,043,155 A | | 3/2000 | Homma et al. ............. 438/691 |
| 6,046,110 A | | 4/2000 | Hirabayashi et al. ....... 438/693 |
| 6,054,379 A | | 4/2000 | Yau et al. ................... 438/623 |
| 6,059,174 A | | 5/2000 | Kojima et al. |
| 6,068,879 A | | 5/2000 | Pasch .......................... 427/97 |
| 6,074,949 A | | 6/2000 | Schonauer et al. .......... 438/692 |
| 6,077,337 A | | 6/2000 | Lee ............................... 106/3 |
| 6,083,840 A | | 7/2000 | Mravic et al. .............. 438/693 |
| 6,096,652 A | | 8/2000 | Watts et al. ................. 438/692 |
| 6,099,394 A | | 8/2000 | James et al. ................... 451/72 |
| 6,117,775 A | | 9/2000 | Kondo et al. ............... 438/690 |
| 6,117,783 A | | 9/2000 | Small et al. ................. 438/693 |
| 6,121,143 A | | 9/2000 | Messner et al. ............ 438/692 |
| 6,136,711 A | | 10/2000 | Grumbine et al. .......... 438/692 |
| 6,156,661 A | | 12/2000 | Small .......................... 438/692 |
| 6,159,076 A | | 12/2000 | Sun et al. ...................... 451/36 |
| 6,171,352 B1 | * | 1/2001 | Lee et al. ...................... 51/307 |
| 6,194,317 B1 | | 2/2001 | Kaisaki et al. .............. 438/692 |
| 6,199,933 B1 | | 3/2001 | Gielda ..................... 296/96.14 |
| 6,217,416 B1 | | 4/2001 | Kaufman et al. ............. 451/41 |
| 6,238,592 B1 | | 5/2001 | Hardy et al. ................ 252/79.1 |
| 6,241,586 B1 | | 6/2001 | Yancey ......................... 451/41 |
| 6,258,721 B1 | | 7/2001 | Li et al. ...................... 438/693 |
| 6,270,393 B1 | | 8/2001 | Kubota et al. ................. 451/36 |
| 6,276,996 B1 | | 8/2001 | Chopra ......................... 451/41 |
| 6,277,015 B1 | | 8/2001 | Robinson et al. ........... 451/528 |
| 6,299,741 B1 | | 10/2001 | Sun et al. .............. 204/224 M |
| 6,416,685 B1 | | 7/2002 | Zhang et al. .............. 252/79.1 |
| 6,451,697 B1 | | 9/2002 | Sun et al. .................... 438/691 |
| 6,509,269 B2 | | 1/2003 | Sun et al. .................... 438/690 |
| 6,524,167 B1 | | 2/2003 | Tsai et al. ..................... 451/41 |
| 6,569,349 B1 | | 5/2003 | Wang et al. ................ 252/79.1 |
| 2003/0010648 A1 | | 1/2003 | Sun et al. ................... 205/640 |

* cited by examiner

SOLUTION TO METAL RE-DEPOSITION DURING SUBSTRATE PLANARIZATION

BACKGROUND OF THE INVENTION

1. Field of the Invention

The present invention relates generally to the fabrication of semiconductor devices and to chemical mechanical polishing and planarization of semiconductor devices.

2. Background of the Related Art

In the fabrication of integrated circuits and other electronic devices, multiple layers of conducting, semiconducting, and dielectric materials are deposited on or removed from a surface of a substrate. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and now electrochemical plating (ECP).

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Chemical mechanical planarization, or chemical mechanical polishing (CMP), is common technique used to planarize substrates. CMP utilizes a chemical composition, typically a slurry or other fluid medium, for selective removal of material from substrates. In conventional CMP techniques, a substrate carrier or polishing head is mounted on a carrier assembly and positioned in contact with a polishing pad in a CMP apparatus. The carrier assembly provides a controllable pressure to the substrate urging the substrate against the polishing pad. The pad is moved relative to the substrate by an external driving force. Thus, the CMP apparatus effects polishing or rubbing movement between the surface of the substrate and the polishing pad while dispersing a polishing composition, or slurry, to effect both chemical activity and mechanical activity.

Conventional CMP processes are performed using an abrasive article, such as a polishing composition, or slurry, containing abrasive particles in a reactive solution with a conventional polishing pad. Alternatively, the abrasive article can be a fixed abrasive article, such as a fixed abrasive polishing pad, which may be used with a CMP composition or slurry that does not contain abrasive particles. A fixed abrasive article typically comprises a backing sheet with a plurality of geometric abrasive composite elements adhered thereto.

Conventional CMP techniques employing polishing pads utilizing CMP compositions containing abrasive particles as well as CMP techniques employing fixed abrasive articles are subject to dishing as a result of overpolishing. Dishing occurs when a portions of the surface of a metal deposited in an aperture or other substrate structure formed in a dielectric layer is excessively polished resulting in one or more concavities or depressions. Dishing performance is used to describe the ability of a CMP composition or process to polish and planarize a surface without dishing or with reduced dishing of the surface. Corrosion inhibitors are added to CMP compositions to reduce dishing, improve dishing performance, and prevent corrosion of materials during the CMP process. The corrosion inhibitors prevent or reduce the corrosion of the metal surfaces.

However, CMP compositions containing corrosion inhibitors have been observed to have reduced metal dissolution during polishing and decreased solubility of polishing by-products, such as metal ions, in comparison to CMP compositions without corrosion inhibitors. The reduced metal dissolution and decreased by-product solubility in CMP compositions can result in deposition or re-deposition of metals and by-products on the substrate during the CMP process. Metals and by-products deposited during CMP processes have been observed to remain as undesirable metal residues after the CMP process and detrimentally affect the polish quality of the substrate surface.

Therefore, there exists a need for a method and CMP composition that reduces the deposition or re-deposition of materials during CMP processing.

SUMMARY OF THE INVENTION

The invention generally provides a method and composition for planarizing a substrate surface with reduced re-deposition of metal during the CMP process. In one aspect, the invention provides a composition for planarizing a substrate, the composition comprising one or more surfactants including one or more anionic surfactants, Zweitter-ionic surfactants, dispersers, or combinations thereof, one or more chelating agents, one or more oxidizers, one or more corrosion inhibitors, and deionized water. The composition may further include one or more agents to adjust the pH of the composition. The CMP composition may also include an abrasive particle concentration of about 35 wt. % or less.

In another aspect, the invention provides a method for removing at least a portion of a material from a substrate surface, the method comprising planarizing the substrate surface using a composition including one or more anionic surfactants, Zweitter-ionic surfactants, dispersers, or combinations thereof. The composition further comprises one or more chelating agents, one or more oxidizers, one or more corrosion inhibitors, deionized water, and may optionally include one or more agents to adjust the pH of the composition or abrasive particles.

Another aspect of the invention provides a method for processing a substrate, comprising forming an aperture in the surface of a substrate, depositing a barrier layer on the surface of the substrate, depositing a metal layer on the barrier layer to fill the aperture, and planarizing the substrate to remove the metal layer above the surface of the substrate using a composition comprising one or more anionic surfactants, Zweitter-ionic surfactants, dispersers, or combinations thereof, one or more chelating agents, one or more oxidizers, one or more corrosion inhibitors, and deionized water. The composition may further comprise one or more agents to adjust the pH of the composition or abrasive particles.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention will be described below in reference to a planrarizing process and composition that can be carried out using chemical mechanical polishing process equipment, such as the Mirra® CMP System available from Applied Materials, Inc., as shown and described in U.S. Pat. No. 5,738,574, entitled, "Continuous Processing System for Chemical Mechanical Polishing," the entirety of which is incorporated herein by reference to the extent not inconsistent with the invention. Although, the CMP process and composition is illustrated utilizing the Mirra® CMP System, any system enabling chemical mechanical polishing using the composition described herein can be used to advantage. The following apparatus description is illustrative and should not be construed or interpreted as limiting the scope of the invention.

Figure 1:
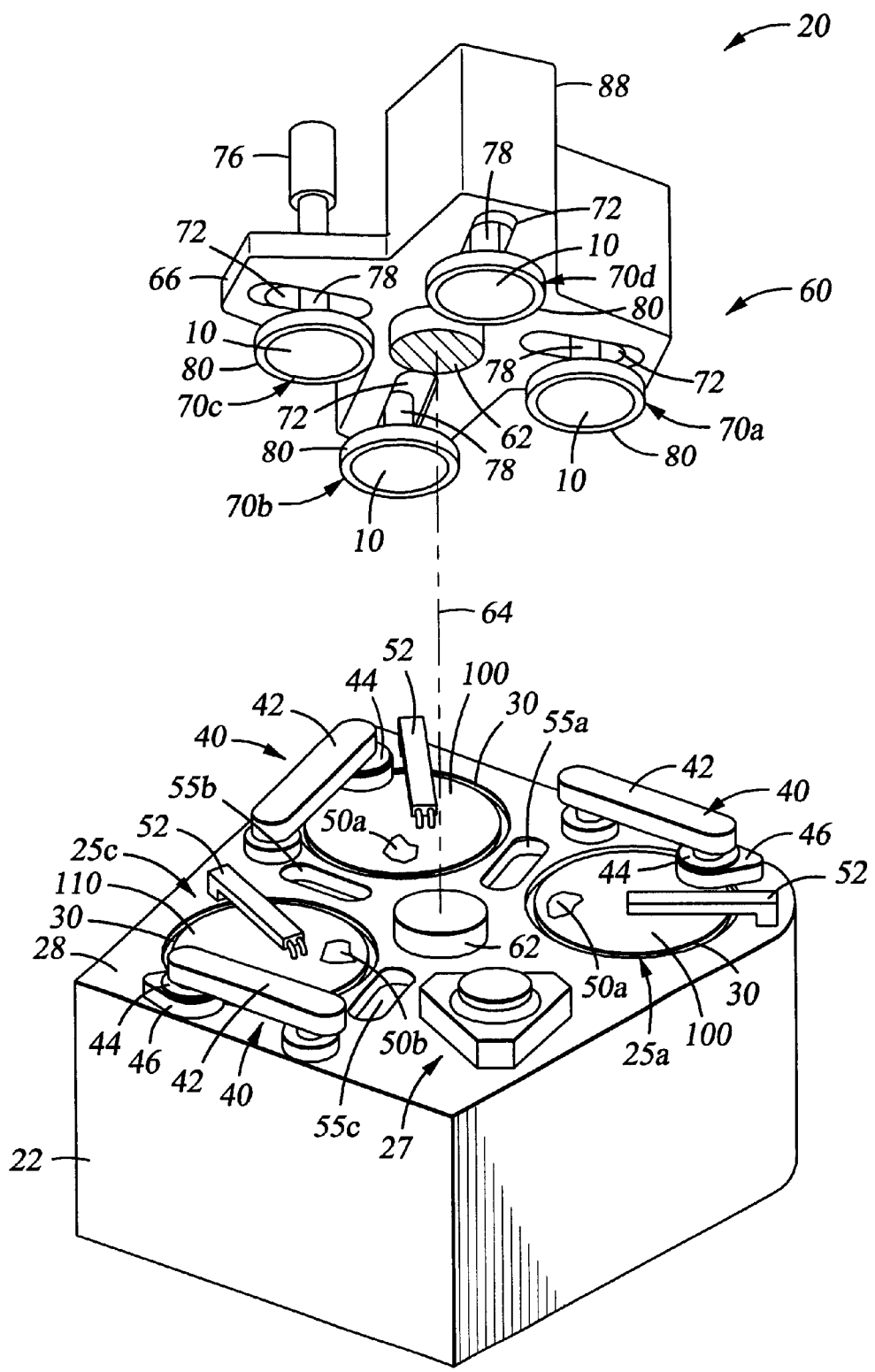
FIG. 1 is a schematic perspective view of a chemical mechanical polishing apparatus.

FIG. 1 is a schematic perspective view of a chemical mechanical polishing apparatus 20. The polishing apparatus 20 includes a lower machine base 22 with a table top 23 mounted thereon and a removable outer cover (not shown). The table top 23 supports a series of polishing stations, including a first polishing station 25a, a second polishing station 25b, a final polishing station 25c, and a transfer station 27. The transfer station 27 serves multiple functions, including, for example, receiving individual substrates 10 from a loading apparatus (not shown), washing the substrates, loading the substrates into carrier heads 80, receiving the substrates 10 from the carrier heads 80, washing the substrates 10 again, and transferring the substrates 10 back to the loading apparatus.

Each polishing station 25a–25c includes a rotatable platen 30 having a polishing pad 100 or 110 disposed thereon. Each platen 30 may be a rotatable aluminum or stainless steel plate connected to a platen drive motor (not shown). The polishing stations 25a–25c may include a pad conditioner apparatus 40. The pad conditioner apparatus 40 has a rotatable arm 42 holding an independently rotating conditioner head 44 and an associated washing basin 46. The pad conditioner apparatus 40 maintains the condition of the polishing pad so that it will effectively polish the substrates. Each polishing station may include a conditioning station if the CMP apparatus is used with other pad configurations.

The polishing stations 25a–25c may each have a slurry/rinse arm 52 that includes two or more supply tubes to provide one or more chemical slurries and/or water to the surface of the polishing pad. The slurry/rinse arm 52 delivers the one or more chemical slurries in amounts sufficient to cover and wet the entire polishing pad. Each slurry/rinse arm 52 also includes several spray nozzles (not shown), that can provide a high-pressure fluid rinse on to the polishing pad at the end of each polishing and conditioning cycle. Furthermore, two or more intermediate washing stations 55a, 55b, and 55c may be positioned between adjacent polishing stations 25a, 25b, and 25c, to clean the substrate as it passes from one station to the next.

A rotatable multi-head carousel 60 is positioned above the lower machine base 22. The carousel 60 includes four carrier head systems 70a, 70b, 70c, and 70d. Three of the carrier head systems receive or hold the substrates 10 by pressing them against the polishing pads 100 or 110 disposed on the polishing stations 25a–25c. One of the carrier head systems 70a–70d receives a substrate from and delivers a substrate 10 to the transfer station 27. The carousel 60 is supported by a center post 62 and is rotated about a carousel axis 64 by a motor assembly (not shown) located within the machine base 22. The center post 62 also supports a carousel support plate 66 and a cover 68.

The four carrier head systems 70a–70d are mounted on the carousel support plate 66 at equal angular intervals about the carousel axis 64. The center post 62 allows the carousel motor to rotate the carousel support plate 66 and orbit the carrier head systems 70a–70d about the carousel axis 64.

Each carrier head system 70a–70d includes one carrier head 80. A carrier drive shaft 78 connects a carrier head rotation motor 76 (shown by the removal of one quarter of the cover 68) to the carrier head 80 so that the carrier head 80 can independently rotate about its own axis. There is one carrier drive shaft 74 and motor 76 for each head 80. In addition, each carrier head 80 independently oscillates laterally in a radial slot 72 formed in the carousel support plate 66.

The carrier head 80 performs several mechanical functions. Generally, the carrier head 80 holds the substrate 10 against the polishing pad 100 or 110, evenly distributes a downward pressure across the back surface of the substrate 10, transfers torque from the drive shaft 78 to the substrate 10, and ensures that the substrate 10 does not slip out from beneath the carrier head 80 during polishing operations.

Chemical Mechanical Polishing Process and Composition

A planarizing process and composition is provided to reduce re-deposition of removed metal species, such as the remove metal and metal ions, on the metal surface being processed. In one aspect of the invention, one or more surfactants are added to a chemical mechanical polishing composition. Such a CMP composition includes the one or more surfactants, one or more chelating agents, one or more oxidizers, one or more corrosion inhibitors, and deionized water. The CMP composition may also further include one or more pH adjusting agents and/or abrasive particles.

Surfactants useful in the CMP composition include those which increase the dissolution or solubility of materials, such as metals and metal ions or by-products produced during the CMP process, or reduce re-deposition of materials on the substrate being processed. The surfactants may include anionic surfactants, Zweitter-ionic surfactants, dispersers, and combinations thereof. Zweitter-ionic surfactants are described broadly herein as surfactants having both anionic and cationic functional groups, and which may have anionic and cationic properties in solutions, such as CMP compositions. Dispersers are defined herein as compounds which have multiple ionic groups in one molecule, and which reduce the surface tension of the composition and promote uniform and maximum separation of solids, such as by-products of the CMP process and abrasive particles in a composition. Dispersers are considered to be surfactants as surfactants are used herein.

Examples of surfactants include sodium salts of polyacrylic acid, e.g., comprising molecular weights from about 1,000 to about 20,000, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, and combinations thereof. The anionic surfactants include potassium oleate, sulfosuccinates, sulfosuccinate derivatives, sulfates of alcohols, alkylanyl sulfonates, carboxylated alcohols, and combinations thereof. The Zweitter-ionic surfactants include sulfonated amines, sulfonated amides, alkylamino propionic acids, alkyliminodipropionic acids, and combinations thereof. The dispersers include sodium salts of polyacrylic acid, e.g., comprising molecular weights from about 1,000 to about 20,000. It is contemplated that other anionic surfactants, Zweitter surfacants, and dispersers may be used and the above described surfactants are illustrative and should not be construed or interpreted as limiting the scope of the invention.

The one or more surfactants can comprise a concentration between about 0.001 volume percent (vol %) and about 10 vol % of the CMP composition. A concentration between about 0.01 vol % and about 2 vol % of the surfactants is used in one embodiment of the CMP composition. CMP composition having between about 0.1 vol % and about 1 vol % may also be used.

The one or more chelating agents may include one or more amine or amide groups, such as ethylenediaminetetraacetic acid, ethylenediamine or methylformamide. The one or more chelating agents can be present in an amount between about 0.2 vol % to about 3.0 vol % of the CMP composition. The chelating agent chemically reacts with metal ions removed from the polished surface to form a soluble metal complex to minimize re-deposition of metal ions on the surface of the substrate.

The oxidizers can be any of various conventional oxidizers employed in CMP compositions and processes, such as hydrogen peroxide, ferric nitride, or other compounds such as iodates. The oxidizers can be present in an amount between about 0.5 vol % and about 8.0 vol % of the CMP composition.

Examples of corrosion inhibitors include, any various organic compounds containing an azole group, such as benzotriazole, mercaptobenzotriazole, or 5-methyl-1-benzotriazole. The corrosion inhibitors can be present in an amount between about 0.02 vol % and about 1.0 vol % of the CMP composition.

The pH adjusting agent or agents can be present in an amount sufficient to adjust the pH of the CMP composition to a range of about 2.5 to about 11 and can comprise any of various bases, such as potassium hydroxide (KOH) or inorganic and/or organic acids, such as acetic acid, phosphoric acid, or oxalic acid. However, other chelating agents, oxidizers, corrosion inhibitors, and pH adjusting agents are contemplated for use with the invention. The above specified components are illustrative and should not be construed as limiting the invention.

In one embodiment of the invention described above, the surfactants are used in a CMP abrasive-free polishing composition with a conventional polishing pad.

Alternatively, embodiments of the invention may include adding abrasive particles to polishing compositions containing the one or more surfactants described herein for planarizing a substrate surface. The compositions containing abrasives particles may comprise an abrasive particle concentration of about 35 wt. % or less of the composition. Alternatively, a concentration between about 2 wt. % or less of abrasive particles is included in CMP compositions containing the one or more surfactants described herein. One example of a CMP composition having abrasive particles includes a colloidal suspension of silicon oxide particles, with an average size of about 50 nm. Other abrasive components which may be used in CMP compositions include, but are not limited to, alumina, zirconium oxide, titanium oxide, or any other abrasives known in the art and used in conventional CMP compositions.

The CMP compositions and processes described herein can be employed to polish and planarize metal layers, including layer comprised of copper, copper alloys, doped copper, aluminum, doped aluminum, nickel, doped nickel, tungsten, tungsten nitride, titanium, titanium nitride, and combinations thereof. It is further contemplated that other materials, including titanium-tungsten (TiW), titanium silicon nitride (TiSiN), tungsten silicon nitride (WSiN), and silicon nitride used for forming barrier layers with conductive materials, such as copper, may be polished and planarized using aspects of the invention.

EXAMPLE

An example of an abrasive-free CMP composition described herein includes between about 0.1 vol % and about 0.2 vol % of sodium polymethacrylate as a surfactant, between about 0.3 vol % and about 3 vol % of ethylenediamine as a chelating agent, between about 0.5 vol % and about 5.0 vol % hydrogen peroxide as the oxidizer, between about 0.02 vol % and about 0.1 vol % benzotriazole as the corrosion inhibitor, and phosphoric acid as the pH adjusting agent to produce a pH level between about 4 and about 8, and distilled water.

One example of an abrasive-free CMP process employs a polishing pressure of about 1 to about 8 psi, and a platen speed of about 20 to 120 rpm for a polishing duration of about 30 seconds to 2,000 seconds in the apparatus described above and shown in FIG. 1.

Figure 2:
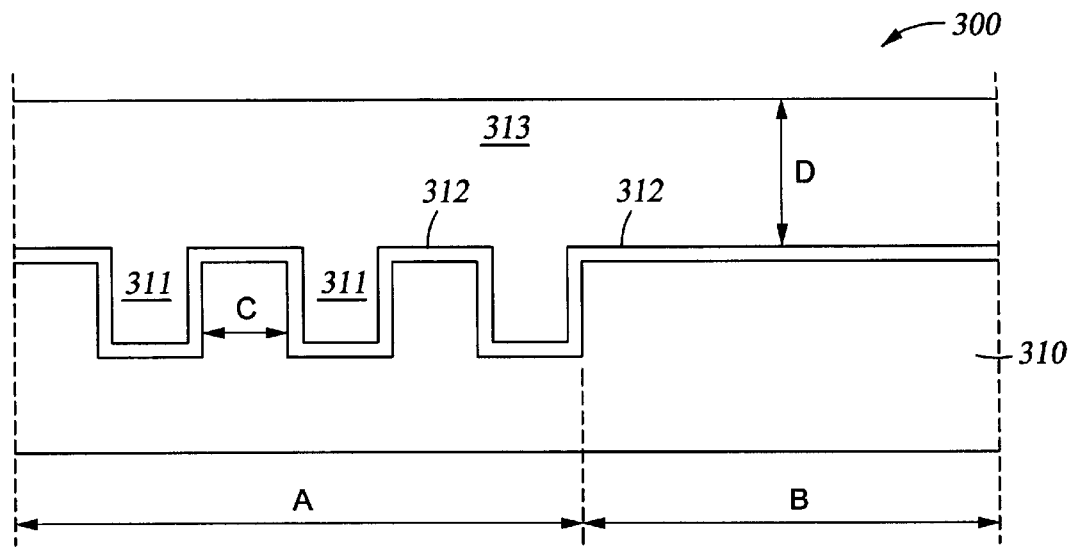
FIGS. 2–4 are schematic diagrams illustrating one embodiment of a process for forming a feature on a substrate.
Figure 3:
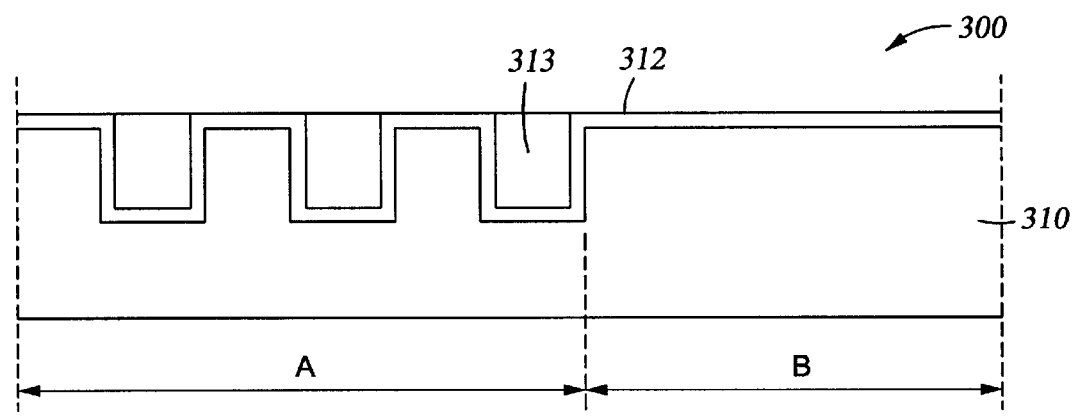
Figure 4:
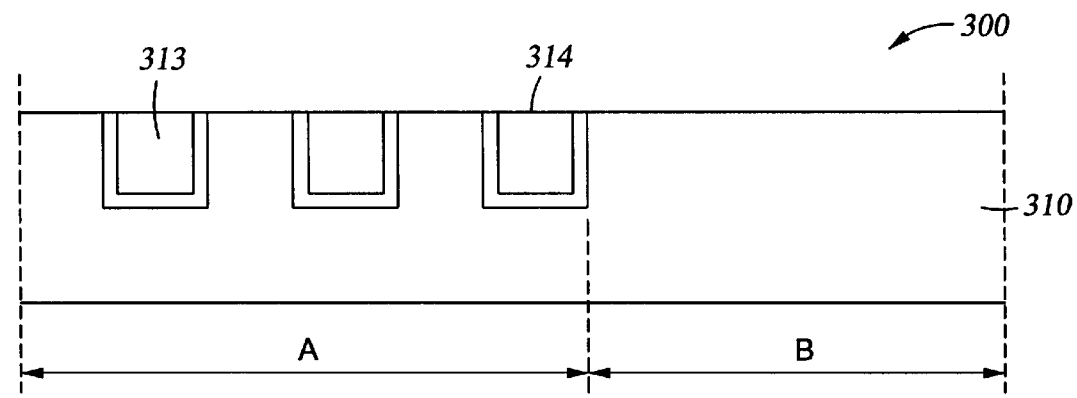

FIGS. 2–4 are schematic diagrams illustrating one embodiment of a process for forming a feature on a substrate utilizing the invention described herein.

Referring to FIG. 2, a dielectric layer 310, such as a silicon oxide or a carbon-doped silicon oxide, is formed on a substrate 300. A plurality of openings 311 are then patterned and etched into the dielectric in area A to form features for a dense array of conductive lines with area B remaining unetched. Typically, the openings 311 are spaced apart by a distance C which can be less than about 1 micron, such as about 0.2 micron, or greater than 10 microns, such as 20 microns. The openings 311 are formed in the dielectric layer 310 by conventional photolithographic and etching techniques. A barrier layer 312 of a conductive material, such as Ta or TaN for a copper metallization, is deposited conformally in openings 311 and on the upper surface of the dielectric layer 310. A copper layer 313 is then deposited at a thickness (D) between about 8,000 Å and about 18,000 Å.

Referring to FIG. 3, the substrate is exposed to a CMP process employing utilizing a polishing composition comprising one or more surfactants to remove at least a portion of the copper layer 313 with high selectivity to TaN barrier layer 312 to stop thereon. A high selectivity to the TaN barrier layer allows for removal of substantially all of the copper layer while minimizing removal of the TaN layer. It has been observed that the resulting features formed with compositions described herein and using a TaN barrier layer exhibit reduced amounts or an absence of metal residues, such as copper residue, on the surface of the substrate after the CMP process. The CMP composition containing the one or more surfactants produced an improved polish quality without detrimentally affecting the performance of the CMP composition. The compositions described herein have been advantageously used in removing conductive materials, such as copper, from barrier layers, such as tantalum nitride, deposited on substrate surfaces Referring to FIG. 4, a second CMP process, or a continuation of the CMP process using a second CMP composition, suitable for planarizing TaN and comprising one or more surfactants, is then performed to remove the TaN barrier layer 312 and to remove or reduce scratching or defects formed on the substrate surface, thereby completing planarization. Alternatively, the second CMP process may use a second CMP composition that does not contain one or more surfactants. The CMP process may also be conducted in one stage to remove the copper layer and barrier layer formed on the surface of the substrate 300 to form the features. The resulting copper features comprises a dense array (A) of copper lines 313 bordered by open field B and the planar surface 314 of the copper metallization and substrate 300.

The invention described herein is applicable to planarizing a substrate surface during various stages of semiconductor manufacturing by any of various CMP techniques using any of various CMP systems and polishing articles, such as fixed abrasive or abrasive slurry-type pads or sheets. The invention described herein enjoys particular applicability in the manufacture of high density semiconductor devices with metal features in the deep submicron range.

While the foregoing is directed to the one or more embodiments of the invention, other and further embodiments of the invention may be devised without departing from the basic scope thereof, and the scope thereof is determined by the claims that follow including their equivalents.

What is claimed is:

1. A composition for planarizing a substrate comprising:
   or more surfactants including one or more anionic surfactants, Zweitter-ionic surfactants, dispersers, or combinations thereof;
   one or more chelating agents;
   one or more oxidizers;
   one or more corrosion inhibitors; and
   water, wherein the composition is abrasive-free.

2. The composition of claim 1, wherein the one or more surfactants comprise sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, or combinations thereof.

3. The composition of claim 1, wherein the one or more surfactants constitute between about 0.001 vol % and about 10 vol % of the composition.

4. The composition of claim 1, wherein the one or more surfactants constitute between about 0.01 vol % and about 2 vol % of the composition.

5. The composition of claim 1, wherein the one or more surfactants constitute between about 0.1 vol % and about 1 vol % of the composition.

6. The composition of claim 1, further comprising one or more agents to adjust the pH.

7. The composition of claim 6, wherein the one or more agents are acids selected from the group of acetic acid, phosphoric acid, oxalic acid, and combinations thereof.

8. The composition of claim 6, wherein the composition comprises:
   between about 0.001 vol % and about 10 vol % of the one or more surfactants;
   between about 0.2 wt. % to about 3.0 wt. % of the one or more chelating agents,
   between about 0.5 wt. % to about 8.0 wt. % of the one or more oxidizers;
   between about 0.02 wt. % to about 1.0 wt. % of the one or more corrosion inhibitors;
   an amount of acid sufficient to achieve a pH of about 2.5 to about 11; and
   the remainder water.

9. The composition of claim 8, wherein the composition is abrasive-free.

10. The composition of claim 1, wherein the composition has a pH of about 2.5 to about 11.0.

11. The composition of claim 1, wherein the composition comprises sodium polymethacrylate at a concentration of between about 0.01 vol % and about 2 vol %.

12. A composition for planarizing a substrate, comprising:
    between about 0.001 vol % and about 10 vol % of a sodium salt of polyacrylic acid;
    one or more chelating agents;
    one or more oxidizers;
    one or more corrosion inhibitors
    up to about 2 wt. % of abrasives; and
    water.

13. The composition of claim 12, wherein the sodium salt of polyacrylic acid comprises between about 0.01 vol % and about 2 vol % of the composition.

14. The composition of claim 12, wherein the sodium salt of polyacrylic acid comprises between about 0.1 vol % and about 1 vol % of the composition.

15. The composition of claim 12, wherein the composition comprises sodium polymethacrylate at a concentration of between about 0.01 vol % and about 2 vol %.

16. The composition of claim 12, further comprising one or more agents to adjust the pH selected from the group of acetic acid, phosphoric acid, oxalic acid, and combinations thereof.

17. The composition of claim 16, wherein the composition comprises:
    between about 0.001 vol % and about 10 vol % of a sodium salt of polyacrylic acid;
    between about 0.2 wt. % to about 3.0 wt. % of the one or more chelating agents,
    between about 0.5 wt. % to about 8.0 wt. % of the one or more oxidizers;
    between about 0.02 wt. % to about 1.0 wt. % of the one or more corrosion inhibitors;
    an amount of acid sufficient to achieve a pH of about 2.5 to about 11;
    up to about 2 wt. % of abrasives; and
    the remainder deionized water.

18. The composition of claim 12, wherein the composition has a pH of about 2.5 to about 11.0.

19. A composition for planarzing a substrate containing a copper-containing material comprising:
    between about 0.1 vol % and about 0.2 vol % of sodium polymethacrylate as a surfactant;

between about 0.3 vol % and about 3 vol % of ethylenediamine as a chelating agent;

between about 0.5 vol % and about 5.0 vol % hydrogen peroxide as an oxidizer;

between about 0.02 vol % and about 0.1 vol % benzotriazole as a corrosion inhibitor;

phosphoric acid as a pH adjusting agent to produce a pH level between about 4 and about 8; and water.

20. The composition of claim 19, wherein the composition further comprises abrasive particles at about 35 wt. % or less of the composition.

21. The composition of claim 20, wherein the composition further comprises abrasive particles at about 2 wt. % or less of the composition.

22. The composition of claim 19, wherein the composition is abrasive-free.

* * * * *

UNITED STATES PATENT AND TRADEMARK OFFICE
CERTIFICATE OF CORRECTION

PATENT NO. : 6,653,242 B1
DATED : November 25, 2003
INVENTOR(S) : Sun et al.

It is certified that error appears in the above-identified patent and that said Letters Patent is hereby corrected as shown below:

Title page,
Item [56], References Cited, please insert -- OTHER PUBLICATIONS
Boisde, et al., "Coumarin", Kirk-Othmer Encyclopedia of Chemical Technology, 22 pages --.

Column 7,
Line 38, please insert -- one -- before "or more surfactants".

Signed and Sealed this

Eleventh Day of May, 2004

JON W. DUDAS
*Acting Director of the United States Patent and Trademark Office*